United States Patent [19]
McClure et al.

[11] Patent Number: 6,034,917
[45] Date of Patent: Mar. 7, 2000

[54] CONTROL CIRCUIT FOR TERMINATING A MEMORY ACCESS CYCLE IN A MEMORY BLOCK OF AN ELECTRONIC STORAGE DEVICE

[75] Inventors: David C. McClure, Carrollton; Tom Youssef, Dallas, both of Tex.

[73] Assignee: STMicroelectronics, Inc., Carrollton, Tex.

[21] Appl. No.: 09/183,589

[22] Filed: Oct. 30, 1998

[51] Int. Cl.[7] .................................................. G11C 8/00
[52] U.S. Cl. ..................... 365/233; 365/233.5; 365/191; 365/194
[58] Field of Search ................. 365/233, 233.5, 365/191, 194

[56] References Cited

U.S. PATENT DOCUMENTS

| | | | |
|---|---|---|---|
| 5,586,286 | 12/1996 | Santeler et al. | 365/233 |
| 5,596,539 | 1/1997 | Passow et al. | 365/210 |
| 5,724,294 | 3/1998 | Khieu | 365/210 |

*Primary Examiner*—David Nelms
*Assistant Examiner*—Vanthu Nguyen
*Attorney, Agent, or Firm*—Theodore E. Galanthay; Lisa K. Jorgenson; Andre Szuwalski

[57] ABSTRACT

A control circuit for terminating a memory access cycle in a memory block having at least one memory cell is disclosed. The at least one memory cell has unique process characteristics. The control circuit includes a memory block activation circuit for generating a memory block activation signal. The memory block activation circuit includes a reset circuit for terminating the memory block activation signal when activated. The control circuit also includes a memory access cycle tracking circuit, responsive to the memory block activation signal, for generating a reset signal. The memory access cycle tracking circuit includes the unique process characteristics of the at least one memory cell for tracking an operation of the at least one memory cell. The reset signal activates the reset circuit so as to terminate the memory block activation signal and terminate the memory access cycle in the memory block.

32 Claims, 5 Drawing Sheets

CONTROL CIRCUIT FOR TERMINATING A MEMORY ACCESS CYCLE IN A MEMORY BLOCK OF AN ELECTRONIC STORAGE DEVICE

FIELD OF THE INVENTION

The present invention relates generally to storage devices and, more particularly, to a control circuit for terminating a memory access cycle in a memory block of an electronic storage device.

BACKGROUND OF THE INVENTION

An electronic storage device, such as a static random access memory (SRAM) device, is typically a monolithic device having both control and memory array circuitry. The control circuitry typically controls access to the memory array circuitry, and the overall state of the electronic storage device. That is, the control circuitry typically controls the manner in which data is written to and read from the memory array circuitry, and the state of operation of the electronic storage device. As a consequence, the control circuitry also typically controls the amount of power that is consumed by the electronic storage device. For example, when data is not being written to or read from the memory array circuitry, the control circuitry is typically not accessing the memory array circuitry and the control circuitry typically places the electronic storage device in an inactive state wherein only a minimal amount of power is consumed. However, when data is either written to or read from the memory array circuitry, the control circuitry is typically accessing the memory array circuitry and the control circuitry typically places the electronic storage device in an active state wherein significantly more power is consumed.

Despite the power savings that occur when the memory array circuitry is not being accessed and the electronic storage device is in the inactive state, there are many occasions when additional power savings are desirable or required. For example, it would be desirable to increase the number and/or the density of electronic storage devices and other heat generating devices placed on a circuit board. That is, the number and/or density of electronic storage devices and other heat generating devices placed on a circuit board is typically limited by the heat dissipation capabilities of the circuit board and/or the environment in which the circuit board is situated. Moreover, increasing the heat dissipation capabilities of the circuit board and changing the environment in which the circuit board is situated are often complex and costly endeavors. For example, liquid cooling schemes and elaborate heat sink designs can be complex and costly solutions to the problem of increasing the number and/or the density of electronic storage devices and other heat generating devices placed on a circuit board.

Another solution to the problem of increasing the number and/or the density of electronic storage devices and other heat generating devices placed on a circuit board is to decrease the power consumed by the electronic storage devices and other heat generating devices. However, this solution has mainly been directed toward decreasing supply voltage levels and instituting the above-described active and inactive states, which have been pursued to the point where no further benefits are economically feasible. Thus, unless some other power consumption limitation technique is devised for electronic storage devices and other heat generating devices, the only solutions to the problem of increasing the number and/or the density of electronic storage devices and other heat generating devices placed on a circuit board are to increase the heat dissipation capabilities of the circuit board or change the environment in which the circuit board is situated, which, as previously described, can be complex and costly.

In view of the foregoing, it would be desirable to provide control circuitry which overcomes the above-stated problems. More particularly, it would be desirable to provide novel control circuitry for limiting power consumption in electronic storage devices and the like.

SUMMARY OF THE INVENTION

According to the present invention, a control circuit for terminating a memory access cycle in a memory block of an electronic storage device is provided. The memory block has a memory cell having a unique characteristic such as, for example, a manufacturing process trait. The manufacturing process trait could be, for example, the size, geometry, doping, and/or parasitic capacitances associated with the memory cell. The control circuit includes a memory block activation circuit for generating an active memory block activation signal. The active memory block activation signal activates the memory block for the memory access cycle. The memory block activation circuit includes a reset circuit for terminating the active memory block activation signal when activated.

The control circuit also includes a memory access cycle tracking circuit, responsive to the active memory block activation signal, for generating an active memory block activation circuit reset signal. The memory access cycle tracking circuit includes the unique characteristic of the memory cell for tracking an operation of the memory cell. For example, the memory access cycle tracking circuit can include all or part of a memory cell that was manufactured according the same process as the memory cell in the memory block so that the memory access cycle tracking circuit can track an operation of the memory cell in the memory block. The active memory block activation circuit reset signal activates the reset circuit in the memory block activation circuit so as to terminate the active memory block activation signal and terminate the memory access cycle in the memory block.

The memory access cycle can be either a memory block read cycle or a memory block write cycle. In the case of a memory block read cycle, the memory access cycle tracking circuit typically includes a memory block read cycle tracking circuit for tracking a read operation of the memory cell. The memory access cycle tracking circuit can also include delay elements for extending the memory block read cycle for a minimum amount of time necessary to complete the memory block read cycle.

In the case of a memory block read cycle, the memory access cycle tracking circuit typically includes a memory block write cycle tracking circuit for tracking a write operation of the memory cell. The memory access cycle tracking circuit can also include delay elements for extending the memory block write cycle for a minimum amount of time necessary to complete the memory block write cycle.

In accordance with another aspect of the present invention, the memory block activation circuit generates the active memory block activation signal in response to at least one memory block access control signal such as, for example, chip enable and address signals. A memory block access control signal could also be an edge transition detection signal which indicates that there is activity on other memory block access control signals. Another memory block access control signal could be an end of edge transition detection signal which indicates that the activity on the other memory block access control signal has ceased. Preferably, the control circuit includes an end of edge transition detection signal generation circuit, that is responsive to an edge transition detection signal, for generating the end of edge transition detection signal.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF A PREFERRED EMBODIMENT

Figure 1:
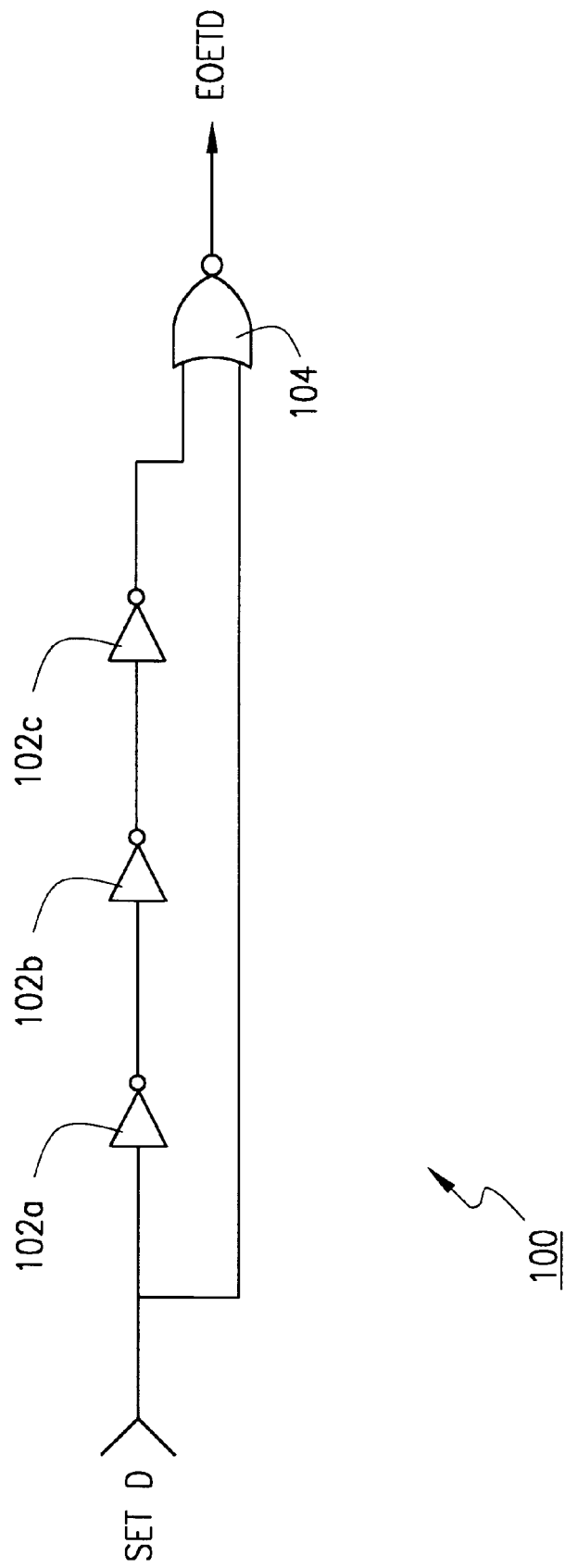
FIG. 1 is a schematic diagram of an end of edge transition detection signal generation circuit for generating an end of edge transition detection signal in accordance with the present invention.

Referring to FIG. 1, there is shown a schematic diagram of an end of edge transition detection signal generation circuit 100 for generating an end of edge transition detection (EOETD) signal in the device incorporating the control circuitry. The end of edge transition detection signal generation circuit 100 includes a series of inverters 102 and a NOR gate 104. The series of inverters 102 provide a delay function for delaying a summation edge transition detection (SETD) signal along a first path before reaching a first input to the NOR gate 104. A second input to the NOR gate 104 receives the SETD signal directly via a second path. The SETD signal is active high if there is any activity on the input pins (e.g., the address and data pins) of the device incorporating the control circuitry. When SETD signal is active high, the EOETD signal is inactive low. When activity ceases on the input pins (e.g., the address and data pins) of the device incorporating the control circuitry, the SETD signal goes inactive low. This inactive low SETD signal is delayed by the series of inverters 102 along the first path before reaching the first input to the NOR gate 104, but is received directly at the second input to the NOR gate 104 via the second path. Thus, the EOETD signal pulses active high (i.e., an active high pulse) when activity ceases on the input pins (e.g., the address and data pins) of the device incorporating the control circuitry.

At this point it should be noted that, for purposes of this detailed description, the device incorporating the control circuitry is a memory device having a plurality of memory blocks. The memory blocks are divided into rows and columns, with the rows being represented by word lines connected to memory cells of the memory device and the columns being represented by bit lines connected to memory cells of the memory device, as is commonly known in the art.

Figure 2:
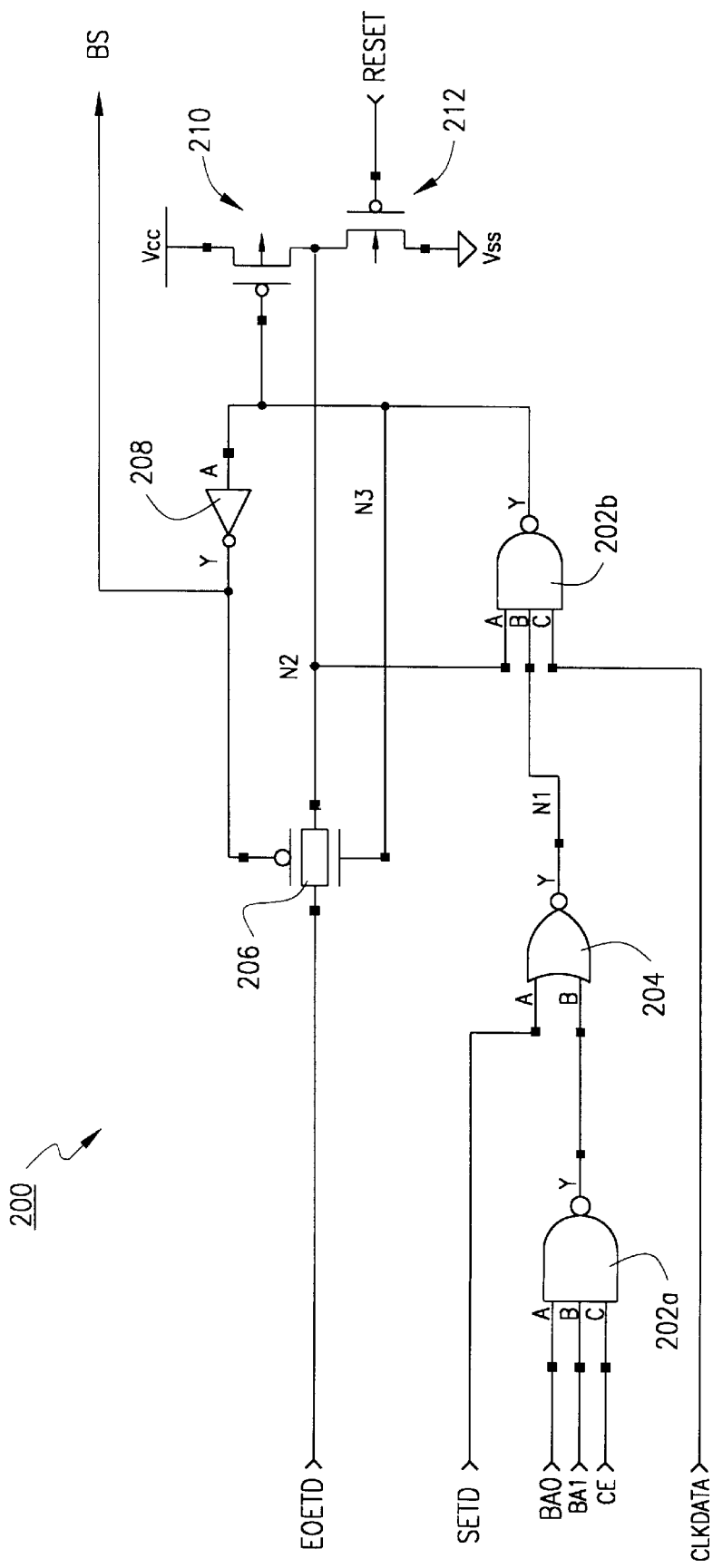
FIG. 2 is a schematic diagram of a memory block selection circuit for controlling memory block selection in accordance with the present invention.

Referring to FIG. 2, there is shown a schematic diagram of a memory block selection circuit 200 for controlling memory block selection in the device incorporating the control circuitry. The memory block selection circuit 200 includes a pair of NAND gates 202, a NOR gate 204, a transmission gate 206, an inverter 208, a P-channel transistor 210, and an N-channel transistor 212. A memory block address bit 0 (BA0) signal, a memory block address bit 1 (BA1) signal, and a chip enable (CE) signal are all applied to the inputs of NAND gate 202a. The BA0 and BA1 signals are just upper order memory block address signals, and the CE signal is the overall device chip enable signal. These signals are active high whenever a memory block access cycle is occurring. The output of NAND gate 202a is connected to a first input of NOR gate 204. The SETD signal is applied to a second input of NOR gate 204. As previously described, the SETD signal is active high if there is any activity on the input pins (e.g., the address and data pins) of the device incorporating the control circuitry. The output of NOR gate 204 is connected to a first input of NAND gate 202b. A data clock ($\overline{\text{CLKDATA}}$) signal is applied to a second input of NAND gate 402b. The $\overline{\text{CLKDATA}}$ signal is active high whenever a memory block access cycle is occurring. The EOETD signal is applied to the input of transmission gate 206. As previously described, the EOETD signal pulses active high (i.e., an active high pulse) when activity ceases on the input pins (e.g., the address and data pins) of the device incorporating the control circuitry. The output of transmission gate 206 is connected to a third input of NAND gate 202b.

In operation, whenever a memory block is being selected, node N1 is high, the $\overline{\text{CLKDATA}}$ signal is active high, and the EOETD signal pulses active high. The EOETD signal active high pulse passes through transmission gate 206, which causes the output of NAND gate 202b to go low and transmission gate 206 to turn off, thereby latching node N2 in a high state. Since the output of NAND gate 202b (i.e., node N3) is low, a block select (BS) signal is high and the memory block is selected. If a reset (RESET) signal from a memory block read/write cycle reset circuit 500 (see FIG. 5) is in a low state, node N2 remains latched in a high state and the memory block stays selected (i.e., BS stays high). only when the SETD signal transitions high, signifying the start of the next memory block access cycle, will the memory block become deselected (i.e., BS will go low). That is, when the SETD signal goes high, node N1 goes low and node N3 goes high, thereby turning on transmission gate 206, which causes node N2 to go low since the EOETD signal will now be low. Since node N3 is now high, the BS signal will be low, which turns off the memory block for a few nanoseconds while the SETD signal is high to allow equalization of bit lines, etc. and to prepare for a new memory block access cycle.

Figure 3:
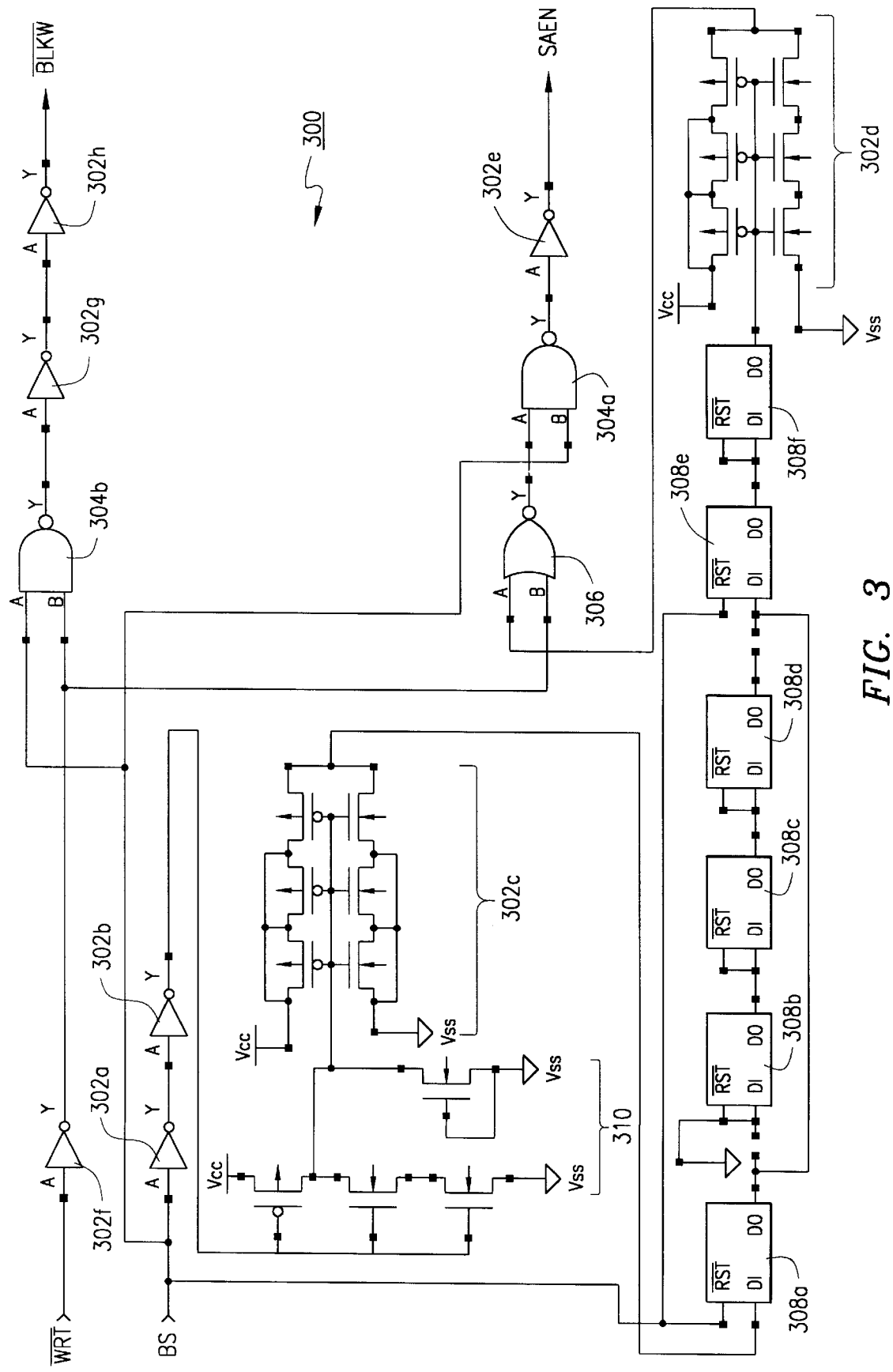
FIG. 3 is a schematic diagram of a memory block read/write cycle control circuit for controlling memory block read and write cycles in accordance with the present invention.

Referring to FIG. 3, there is shown a schematic diagram of a memory block read/write cycle control circuit 300 for controlling memory block read and write cycles in the device incorporating the control circuitry. The memory block read/write cycle control circuit 300 includes inverters 302, NAND gates 304, NOR gate 306, delay elements 308, and a read sequence tracking circuit 310. The BS signal from the memory block selection circuit 200 is passed through inverters 302a and 302b and applied to the read sequence tracking circuit 310, which mimics the characteristics of a memory cell during a memory block read cycle. That is, the read sequence tracking circuit 310 includes all or part of a memory cell that was manufactured according the same process as a memory cell in the memory block so that the read sequence tracking circuit 310 can track a read operation of a memory cell in the memory block. The output of the read sequence tracking circuit 310 is inverted by inverter 302c, passed through delay elements 308, and then inverted again by inverter 302d. It should be noted that the inverted output of the read sequence tracking circuit 310 is only passed through delay elements 308a, 308e, and 308f, as delay elements 308b, 308c, and 308d are not connected. It should also be noted that each of the delay elements 308 are only active for high going signals. That is, each delay element 308 will significantly delay (e.g., for approximately 2 nanoseconds) a high going signal between a delay input (DI) pin and a delay output (DO) pin, but will only minimally delay (e.g., for only a propagation delay of approximately 200 picoseconds) a low going signal between the DI pin and the DO pin. It should further be noted that each delay element 308 has an active low reset($\overline{RST}$) pin for resetting each delay element 308.

The output of inverter 302d is applied to a first input of NOR gate 306. A memory block write enable ($\overline{WRT}$) signal is inverted by inverter 302f and then applied to a second input of NOR gate 306. The $\overline{WRT}$ signal is active low whenever a memory block write cycle is occurring. Conversely, the $\overline{WRT}$ signal is inactive high whenever a memory block read cycle is occurring. Accordingly, the inverted $\overline{WRT}$ signal is applied to the second input of NOR gate 306 so as to allow a sense amplifier enable (SAEN) signal to be active high whenever a memory block read cycle is occurring. More particularly, the SAEN signal becomes active high during a memory block read cycle only after the BS signal has been delayed by the read sequence tracking circuit 310 and the delay elements 308. At this point it should be noted that besides indicating when a memory block read cycle is occurring, the SAEN signal enables a voltage sense amplifier circuit (not shown). It should also be noted that the number of delay elements is chosen so as to allow for an adequate sensing margin.

The inverted $\overline{WRT}$ signal is also applied to a first input of NAND gate 304b. The BS signal from the memory block selection circuit 200 is applied to a second input of NAND gate 304b. The output of NAND gate 304b is passed through inverters 302g and 302h so as to generate a memory block write ($\overline{BLKW}$) signal. The $\overline{BLKW}$ signal is active low whenever the $\overline{WRT}$ signal is active low and the BS signal is active high (i.e., whenever a memory block write cycle is occurring).

Figure 4:
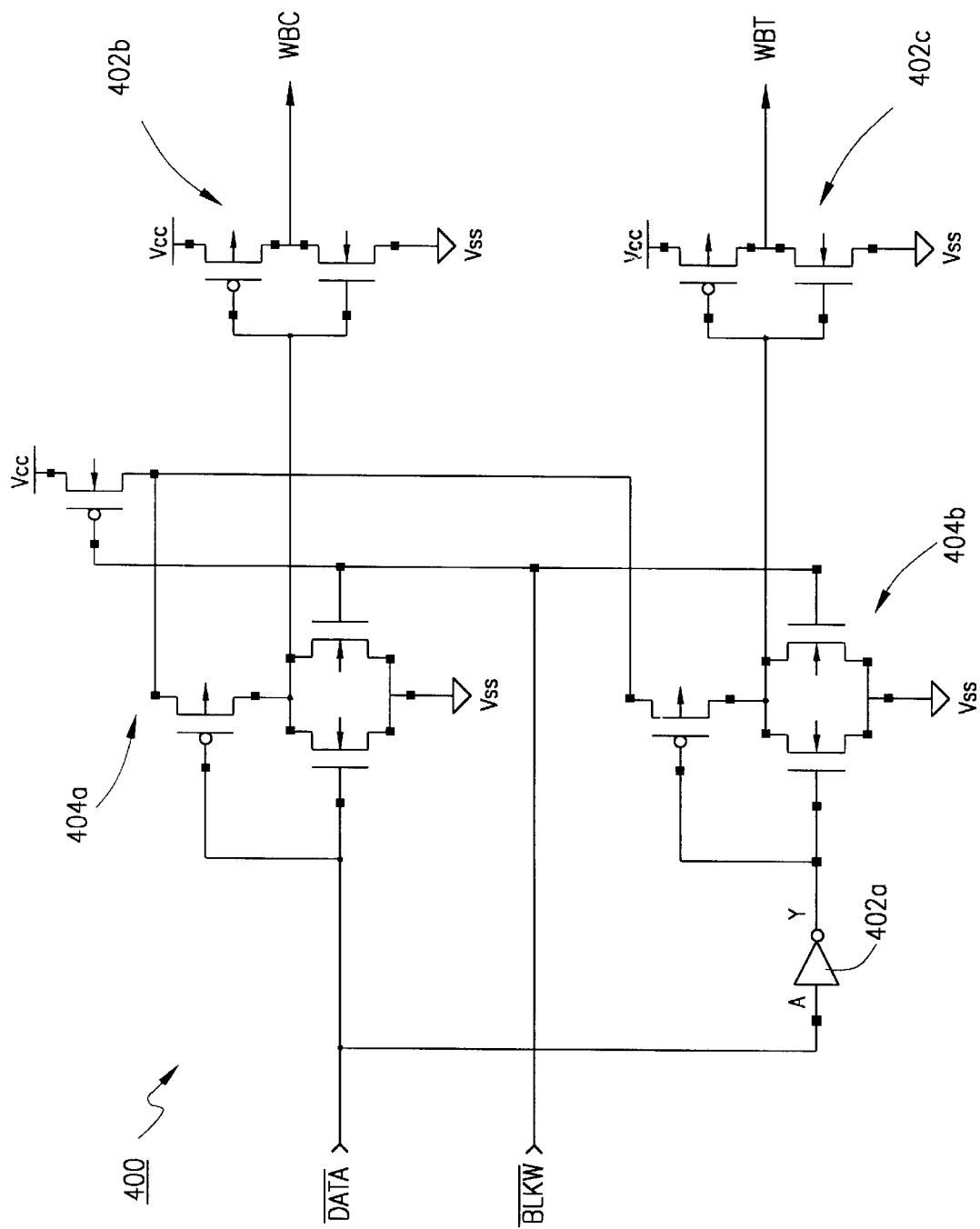
FIG. 4 is a schematic diagram of a memory block write cycle driver circuit for generating memory block write cycle bus signals in accordance with the present invention.

Referring to FIG. 4, there is shown a schematic diagram of a memory block write cycle driver circuit 400 for generating memory block write cycle bus signals in the device incorporating the control circuitry. The memory block write cycle driver circuit 400 includes inverters 402 and a pair of logic circuits 404. The $\overline{BLKW}$ signal is applied to both logic circuits 404a and 404b. A data ($\overline{DATA}$) signal is applied to directly logic circuit 404a, but is passed through inverter 402a before being applied to logic circuit 404b. The $\overline{DATA}$ signal represents the opposite state of data that is to be written to memory cell during a memory block write cycle. Regardless of the state of the $\overline{DATA}$ signal, if the $\overline{BLKW}$ signal is in the inactive high state, both a write bus true (WBT) signal and a write bus complement (WBC) signal are in a high state. However, if the $\overline{BLKW}$ signal is in the active low state, either the WBT signal or the WBC signal will be in a low state depending upon the state of the $\overline{DATA}$ signal. For example, when the $\overline{BLKW}$ signal is in the active low state and the $\overline{DATA}$ signal is in the low state, the WBT signal will be in a high state and the WBC signal will be in a low state. At this point it should be noted that the WBT signal and the WBC signal are typically provided to bit lines via column select pass gates (not shown).

Figure 5:
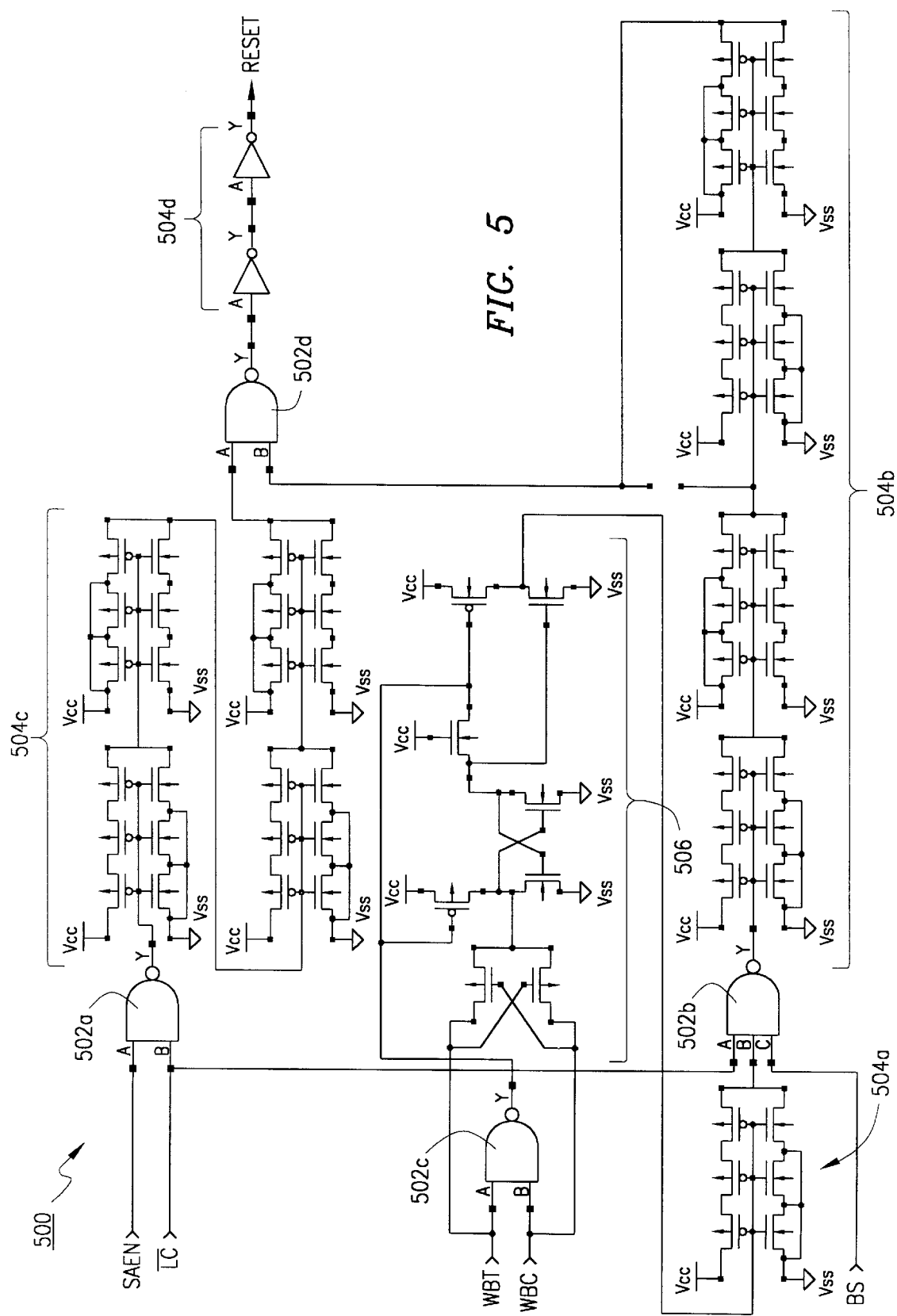
FIG. 5 is a schematic diagram of a memory block read/write cycle reset circuit for generating a memory block read or write cycle reset signal in accordance with the present invention.

Referring to FIG. 5, there is a schematic diagram of a memory block read/write cycle reset circuit 500 for generating a memory block read or write cycle reset signal in the device incorporating the control circuitry. The memory block read/write cycle reset circuit 500 includes NAND gates 502, inverters 504, and write sequence tracking circuit 506. A long cycle ($\overline{LC}$) signal is applied to a first input of both NAND gate 502a and NAND gate 502b. The $\overline{LC}$ signal is active low and is typically only used when testing the device incorporating the control circuitry. That is, when the $\overline{LC}$ signal is in an active low state, memory block read and write cycles are extended for purposes of testing the device incorporating the control circuitry. However, in normal operation, which is when the present invention is most useful, the $\overline{LC}$ signal is in an inactive high state. Thus, for purposes of this detailed description, it is assumed that the $\overline{LC}$ signal is in an inactive high state.

The SAEN signal from the memory block read/write cycle control circuit 300 is applied to a second input of NAND gate 502a. As previously described, the SAEN input signal becomes active-high during a memory block read cycle only after the BS signal has been delayed by the read sequence tracking circuit 310 and the delay elements 308. Thus, during normal operation, the output of NAND gate 502a goes low only after the BS signal has been delayed by the read sequence tracking circuit 310 and the delay elements 308. The output of NAND gate 502a is passed through inverters 504c and is applied to a first input of NAND gate 502d.

The WBT and WBC signals from the memory block write cycle driver circuit 400 are applied to first and second inputs, respectively, of NAND gate 502c. The WBT and WBC signals are also applied to the write sequence tracking circuit 506, as is the output of NAND gate 502c. Analogous to the read sequence tracking circuit 310, the write sequence tracking circuit 506 mimics the characteristics of a memory cell during a memory block write cycle. That is, the write sequence tracking circuit 506 includes all or part of a memory cell that was manufactured according the same process as a memory cell in the memory block so that the write sequence tracking circuit 506 can track a write operation of a memory cell in the memory block. The output of the write sequence tracking circuit 506 is inverted by inverter 504a and applied to a second input of NAND gate 502b. The BS signal, which when active high indicates that a memory block is being selected, is applied to a third input of NAND gate 502b. The output of NAND gate 502b is passed through inverters 504b and is applied to a second input of NAND gate 502d. At this point it should be noted that inverters 504b and 504c, as well as inverters 302a–d, 302g, 302h, 402b, and 402c, provide necessary additional delays when terminating a memory block read cycle or a memory block write cycle, respectively, as described in detail below.

The output of NAND gate 502d is passed through inverters 504d so as to provide the RESET signal to the memory block selection circuit 200. As previously described, when the RESET signal is in an inactive low state, node N2 (see FIG. 2) will remain latched in a high state and the memory block will stay selected (i.e., BS will stay high). However, when the RESET signal transitions to an active high state, node N2 (see FIG. 2) becomes low, node N3 becomes high, and the BS signal becomes low, thereby deselecting the memory block and terminating the current memory block read cycle or memory block write cycle. Once the memory block is deselected, word lines turn off and the reading or writing ceases. Additionally, the bit lines are recovered and equilibrated.

The RESET signal becomes active high during a memory block read cycle when the SAEN signal becomes active high and the output of NAND gate 502a passes through inverters 504c, NAND gate 502d, and inverters 504d. The delays involved in generating the active high SAEN signal (particularly with the read sequence tracking circuit 310 and delay elements 308) and the delays associated with NAND gate 502a, inverters 504c, NAND gate 502d, and inverters 504d are all predetermined so that a memory block read cycle will terminate after a sufficient, but shortened, period of time, thereby reducing the power consumption of the device incorporating the control circuitry. That is, the device incorporating the control circuitry will be active for only the minimum amount of time necessary for a memory block read cycle to be completed, thereby reducing the power consumption of the device.

Analogously, the RESET signal becomes active high during a memory block write cycle when either the WBT or WBC signal becomes low, the WBT or WBC signals and the output of NAND gate 502c pass through the write sequence tracking circuit 506, and the output of the write sequence tracking circuit 506 passes through inverter 504a, NAND gate 502b, inverters 504b, NAND gate 502d, and inverters 504d. The delays involved in generating either a low WBT or WBC signal and the delays associated with NAND gate 502c, the write sequence tracking circuit 506, inverter 504a, NAND gate 502b, inverters 504b, NAND gate 502d, and inverters 504d are all predetermined so that a memory block write cycle will terminate after a sufficient, but shortened, period of time, thereby reducing the power consumption of the device incorporating the control circuitry. That is, the device incorporating the control circuitry will be active for only the minimum amount of time necessary for a memory block write cycle to be completed, thereby reducing the power consumption of the device.

At this point it should be noted that if there is any activity on the input pins (e.g., the address and data pins) of the device incorporating the control circuitry, then the SETD signal will go active high, thereby instantaneously terminating the current memory block read cycle or memory block write cycle by causing the BS signal to go to the inactive low state. All of the above-described circuitry will be reset and the memory block will remain deselected for as long as the SETD signal remains active high. Only when the SETD signal transitions to the inactive low state and the EOETD signal becomes active high will a new memory cycle be able to start. Thus, similar to above-described operation, the device incorporating the control circuitry will be active for only a minimal amount of time, thereby reducing the power consumption of the device.

It should also be noted that the delays used to accomplish the foregoing functionality all track with process variations which provides for manufacturing robustness. Also, the control circuitry is totally asynchronous.

The present invention is not to be limited in scope by the specific embodiments described herein. Indeed, various modifications of the present invention, in addition to those described herein, will be apparent to those of skill in the art from the foregoing description and accompanying drawings. Thus, such modifications are intended to fall within the scope of the appended claims.

What is claimed is:

1. A control circuit for terminating a memory access cycle in a memory block having at least one memory cell, the at least one memory cell having unique process characteristics, the control circuit comprising:

a memory block activation circuit for generating a memory block activation signal, the memory block activation circuit including a reset circuit for terminating the memory block activation signal when activated; and a memory access cycle tracking circuit, responsive to the memory block activation signal, for generating a reset signal, the memory access cycle tracking circuit including the unique process characteristics of the at least one memory cell for tracking an operation of the at least one memory cell;

wherein the reset signal activates the reset circuit so as to terminate the memory block activation signal and terminate the memory access cycle in the memory block.

2. (Amended) The control circuit as defined in claim 1, wherein the unique process characteristics of the at least one memory cell are manufacturing process characteristics associated with the at least one memory cell.

3. The control circuit as defined in claim 1, wherein the memory block activation circuit generates the memory block activation signal in response to at least one memory block access control signal.

4. The control circuit as defined in claim 3, wherein one of the at least one memory block access control signal is an edge transition detection signal indicating activity on others of the at least one memory block access control signal.

5. The control circuit as defined in claim 4, wherein another of the at least one memory block access control signal is an end of edge transition detection signal indicating activity on others of the at least one memory block access control signal has ceased.

6. The control circuit as defined in claim 5, further comprising:

an end of edge transition detection signal generation circuit, responsive to the edge transition detection signal, for generating the end of edge transition detection signal.

7. The control circuit as defined in claim 1, wherein the memory access cycle is a memory block read cycle.

8. The control circuit as defined in claim 7, wherein the memory access cycle tracking circuit includes:

a memory block read cycle tracking circuit for tracking a read operation of the at least one memory cell.

9. The control circuit as defined in claim 8, wherein the memory access cycle tracking circuit includes:

delay elements for extending the memory block read cycle for a minimum amount of time necessary to complete the memory block read cycle.

10. The control circuit as defined in claim 1, wherein the memory access cycle is a memory block write cycle.

11. The control circuit as defined in claim 10, wherein the memory access cycle tracking circuit includes:

a memory block write cycle tracking circuit for tracking a write operation of the at least one memory cell.

12. The control circuit as defined in claim 11, wherein the memory access cycle tracking circuit includes:

delay elements for extending the memory block write cycle for a minimum amount of time necessary to complete the memory block write cycle.

13. A method for terminating a memory access cycle in a memory block having at least one memory cell, the at least one memory cell having unique process characteristics, the method comprising the steps of:

generating a memory block activation signal for activating the memory block;

generating a reset signal based upon the unique process characteristics of the at least one memory cell; and terminating the memory block activation signal based upon the reset signal so as to terminate the memory access cycle in the memory block.

14. The method as defined in claim 13, wherein the unique process characteristics of the at least one memory cell are manufacturing process characteristics associated with the at least one memory cell.

15. The method as defined in claim 13, further comprising the step of:

receiving at least one memory block access control signal for generating the memory block activation signal.

16. The method as defined in claim 15, wherein one of the at least one memory block access control signal is an edge transition detection signal indicating activity on others of the at least one memory block access control signal.

17. The method as defined in claim 16, wherein another of the at least one memory block access control signal is an end of edge transition detection signal indicating activity on others of the at least one memory block access control signal has ceased.

18. The method as defined in claim 17, further comprising the step of:

generating the end of edge transition detection signal.

19. The method as defined in claim 13, wherein the memory access cycle is a memory block read cycle.

20. The method as defined in claim 19, wherein the step of generating the reset signal includes:

tracking a read operation of the memory cell based upon the unique process characteristics of the at least one memory cell.

21. The method as defined in claim 20, wherein the step of generating the reset signal further includes:

generating the reset signal after a minimum amount of time necessary to complete the memory block read cycle.

22. The method as defined in claim 13, wherein the memory access cycle is a memory block write cycle.

23. The method as defined in claim 22, wherein the step of generating the reset signal includes:

tracking a write operation of the memory cell based upon the unique process characteristics of the at least one memory cell.

24. The method as defined in claim 23, wherein the step of generating the reset signal further includes:

generating the reset signal after a minimum amount of time necessary to complete the memory block write cycle.

25. A method for terminating a memory access cycle in a memory block having at least one memory cell, the at least one memory cell having unique process characteristics, the method comprising the steps of:

activating the memory block for a memory access cycle;

generating a memory block reset signal based upon the unique process characteristics of the at least one memory cell; and deactivating the memory block based upon the memory block reset signal so as to terminate the memory access cycle in the memory block.

26. The method as defined in claim 25, wherein the unique process characteristics of the at least one memory cell are manufacturing process characteristics associated with the at least one memory cell.

27. The method as defined in claim 25, wherein the memory access cycle is a memory block read cycle.

28. The method as defined in claim 27, wherein the step of generating the memory block reset signal includes:

tracking a read operation of the at least one memory cell based upon the unique process characteristics of the at least one memory cell.

29. The method as defined in claim 28, wherein the step of generating the memory block reset signal further includes:

generating the memory block reset signal after a minimum amount of time necessary to complete the memory block read cycle.

30. The method as defined in claim 25, wherein the memory access cycle is a memory block write cycle.

31. The method as defined in claim 30, wherein the step of generating the memory block reset signal includes:

tracking a write operation of the at least one memory cell based upon the unique process characteristics of the at least one memory cell.

32. The method as defined in claim 31, wherein the step of generating the memory block reset signal further includes:

generating the memory block reset signal after a minimum amount of time necessary to complete the memory block write cycle.

* * * * *